United States Patent
Burnham et al.

(10) Patent No.: US 7,138,691 B2
(45) Date of Patent: Nov. 21, 2006

(54) SELECTIVE NITRIDATION OF GATE OXIDES

(75) Inventors: Jay S. Burnham, Fletcher, VT (US); John J. Ellis-Monaghan, Grand Isle, VT (US); James S. Nakos, Essex Junction, VT (US); James J. Quinlivan, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 10/707,897

(22) Filed: Jan. 22, 2004

(65) Prior Publication Data

US 2005/0164444 A1 Jul. 28, 2005

(51) Int. Cl.
*H01L 29/76* (2006.01)
(52) U.S. Cl. .................... 257/410; 257/369
(58) Field of Classification Search .......... 257/410, 257/411, 369
See application file for complete search history.

(56) References Cited

U.S. PATENT DOCUMENTS

| | | | |
|---|---|---|---|
| 4,774,197 A | 9/1988 | Haddad et al. | |
| 5,939,763 A | 8/1999 | Hao et al. | |
| 5,952,706 A | 9/1999 | Bashir | |
| 6,184,110 B1 | 2/2001 | Ono et al. | |
| 6,251,800 B1 | 6/2001 | Sun et al. | |
| 6,323,106 B1 | 11/2001 | Huang et al. | |
| 6,440,829 B1 | 8/2002 | Roy et al. | |
| 6,444,555 B1 | 9/2002 | Ibok | |
| 6,538,278 B1 * | 3/2003 | Chau ...................... 257/324 |
| 6,610,615 B1 | 8/2003 | McFadden et al. | |
| 6,690,046 B1 * | 2/2004 | Beaman et al. ............. 257/288 |
| 6,700,170 B1 * | 3/2004 | Morosawa et al. ......... 257/410 |
| 6,821,833 B1 * | 11/2004 | Chou et al. ................. 438/199 |
| 6,853,037 B1 * | 2/2005 | Kudo et al. ................. 257/369 |
| 2002/0022325 A1 | 2/2002 | Gardner et al. | |
| 2002/0022376 A1 | 2/2002 | Oh | |

* cited by examiner

*Primary Examiner*—Mark V. Prenty
(74) *Attorney, Agent, or Firm*—William Sabo, Esq.; Greenblum & Bernstein P.L.C.

(57) ABSTRACT

A semiconductor structure includes thin gate dielectrics that have been selectively nitrogen enriched. The amount of nitrogen introduced is sufficient to reduce or prevent gate leakage and dopant penetration, without appreciably degrading device performance. A lower concentration of nitrogen is introduced into pFET gate dielectrics than into nFET gate dielectrics. Nitridation may be accomplished selectively by various techniques, including rapid thermal nitridation (RTN), furnace nitridation, remote plasma nitridation (RPN), decoupled plasma nitridation (DPN), well implantation and/or polysilicon implantation.

8 Claims, 14 Drawing Sheets

SELECTIVE NITRIDATION OF GATE OXIDES

BACKGROUND OF INVENTION

1. Field of the Invention

The invention generally relates to a semiconductor device and method of manufacture and, more particularly, to a semiconductor having selectively nitrided gate oxides.

2. Background Description

Silicon dioxide has served as the gate insulator of choice for field effect transistors (FETs) for many years. The reason is that silicon dioxide offers a combination of desired properties including good electron and hole mobility, ability to maintain electronic (surface) states at the interface low, relatively low trapping rates of holes and electrons and excellent compatibility with CMOS processing. Typically, a thin gate insulator is desired to better couple and control the electric potential from the gate electrode to the channel.

Concomitantly, continued advancement of integrated circuit technology depends in part on scaling of device dimensions. However, as the thickness of silicon dioxide films decrease with each generation of semiconductor devices, leakage current through the dielectric increases and eventually becomes unacceptable. Additionally, decreased thickness enables penetration of dopants (e.g., boron) from the gate into the gate dielectric, counter doping the channel and thereby degrading performance.

One method that has emerged to reduce these undesirable effects entails introducing nitrogen into gate $SiO_2$. As nitrogen is introduced, the dielectric constant of the gate increases. The introduction of nitrogen substantially reduces boron penetration even at relatively low concentrations. In higher concentrations, introduced nitrogen reduces gate leakage. Unfortunately, high concentrations of nitrogen cause threshold-voltage shifts, particularly on pFETs. Thus, to reduce the adverse impact on pFETs, the maximum nitrogen introduced is limited, at the expense of gate leakage, particularly in nFETs.

The invention is directed to overcoming one or more of the problems as set forth above.

SUMMARY OF INVENTION

In a first aspect of the invention, a method of fabricating a semiconductor structure with nitrogen enriched active device features is provided. The method entails forming a first feature of a first active device and a second feature of a second active device. A first amount of nitrogen is introduced into the first feature of the first active device. A second amount of nitrogen is introduced into the second feature of the second active device. The second amount of nitrogen is different from the first amount of nitrogen.

In another aspect of the invention, a method of fabricating a semiconductor structure entails forming a dielectric layer on a semiconductor substrate. The dielectric layer has a first portion corresponding to a first dielectric gate and a second portion corresponding to a second dielectric gate. A first concentration of nitrogen is introduced into the first portion of the dielectric layer. A second concentration of nitrogen is introduced into the second portion of the dielectric layer. The second concentration of nitrogen is different from the first concentration of nitrogen.

In still a further aspect of the invention, a semiconductor structure is provided. The structure includes a semiconductor substrate. The structure also has a first active device formed on the substrate. The first active device has a first dielectric gate and the first dielectric gate has a first concentration of nitrogen. Additionally, the structure includes a second active device formed on the substrate. The second active device has a second dielectric gate with a second concentration of nitrogen. The second concentration of nitrogen is different than the first concentration of nitrogen.

DETAILED DESCRIPTION

The invention enables independently introducing nitrogen into (i.e., nitridation of) nFET and pFET gate dielectrics. The amount of nitrogen introduced is sufficient to reduce or prevent gate leakage and dopant penetration, without appreciably degrading device performance. An exemplary implementation introduces a lower concentration of nitrogen into pFET gate dielectrics than into nFET gate dielectrics, and a low concentration, no nitrogen, or a high concentration into areas having thick gate dielectric that are not susceptible to appreciable dopant diffusion and current leakage.

Figure 1:
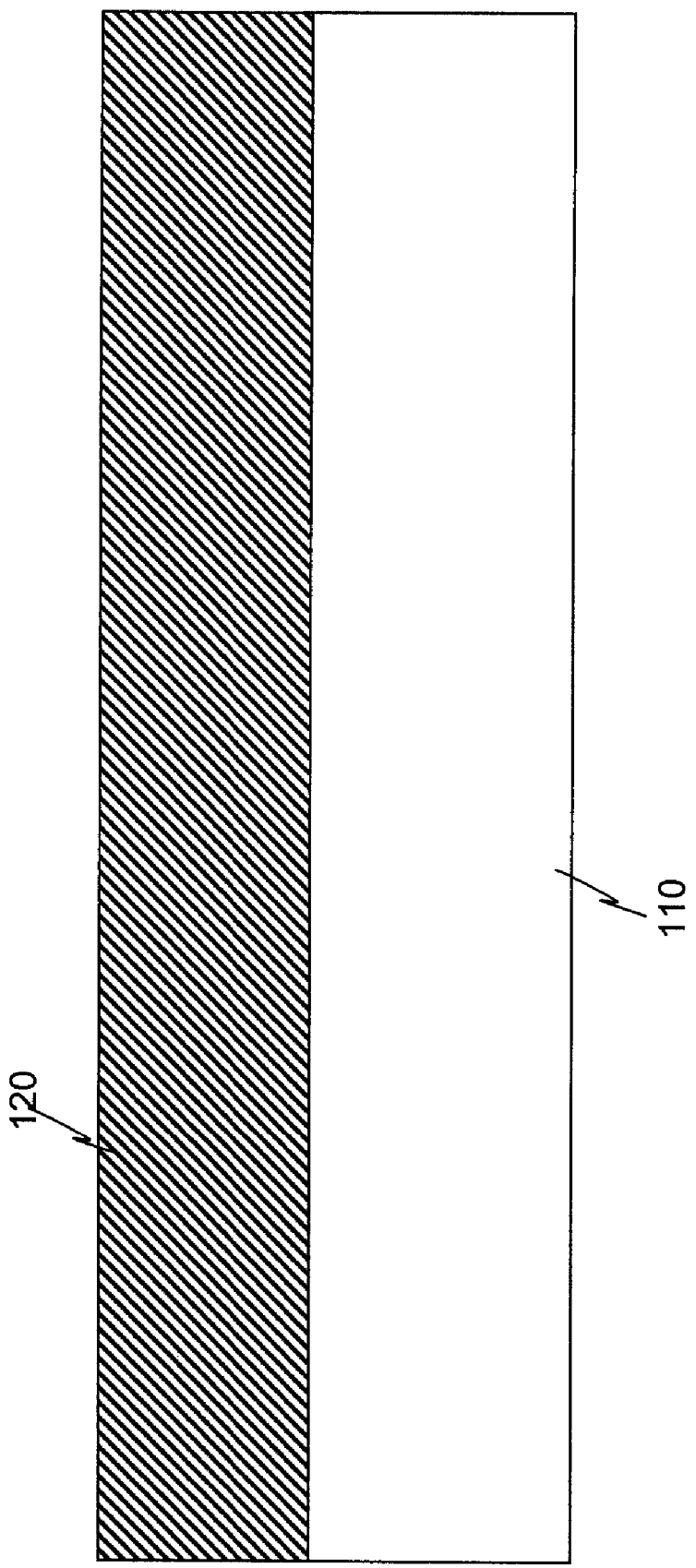
FIG. 1 shows a structure with a dielectric layer having areas that correspond to various devices according to the principles of an exemplary implementation of the invention.

In one implementation, a semiconductor device including a substrate 110 and gate dielectric layer 120 is formed in a conventional manner, as shown in FIG. 1. A process according to the principles of the invention modifies portions of the device before formation of the gate electrode which overlies the gate dielectric, and before formation of spacers which surround the gate electrode.

The substrate 110 may, for example, be a silicon substrate or an epitaxial silicon layer formed on a substrate. A gate dielectric layer 120 (also referred to herein as an "oxide layer"), such as an $SiO_2$ layer, is formed on the surface using processes well known in the art such as a thermal growing process.

Gate dielectric may be patterned and etched to form dielectric layers having various thicknesses for various active devices. Different dielectric layers may have different thicknesses to accommodate different types of devices. Thick areas, such as 120, having gate dielectric thicknesses above approximately 50 Å, typically do not experience substantial dopant diffusion or current leakage, while areas of less than 50 Å, particularly those areas of 20 Å or less are susceptible to appreciable dopant diffusion and leakage current. Consequently, areas having gate dielectric thicknesses above approximately 50 Å do not warrant nitridation.

Different areas may also correspond to different types of devices. For example, certain gate dielectric areas having a thickness of 20 Å or less may correspond to nFETs and pFETs. Thin areas corresponding to nFETs, benefit from greater nitridation than thin areas corresponding to pFETs.

Figure 2:
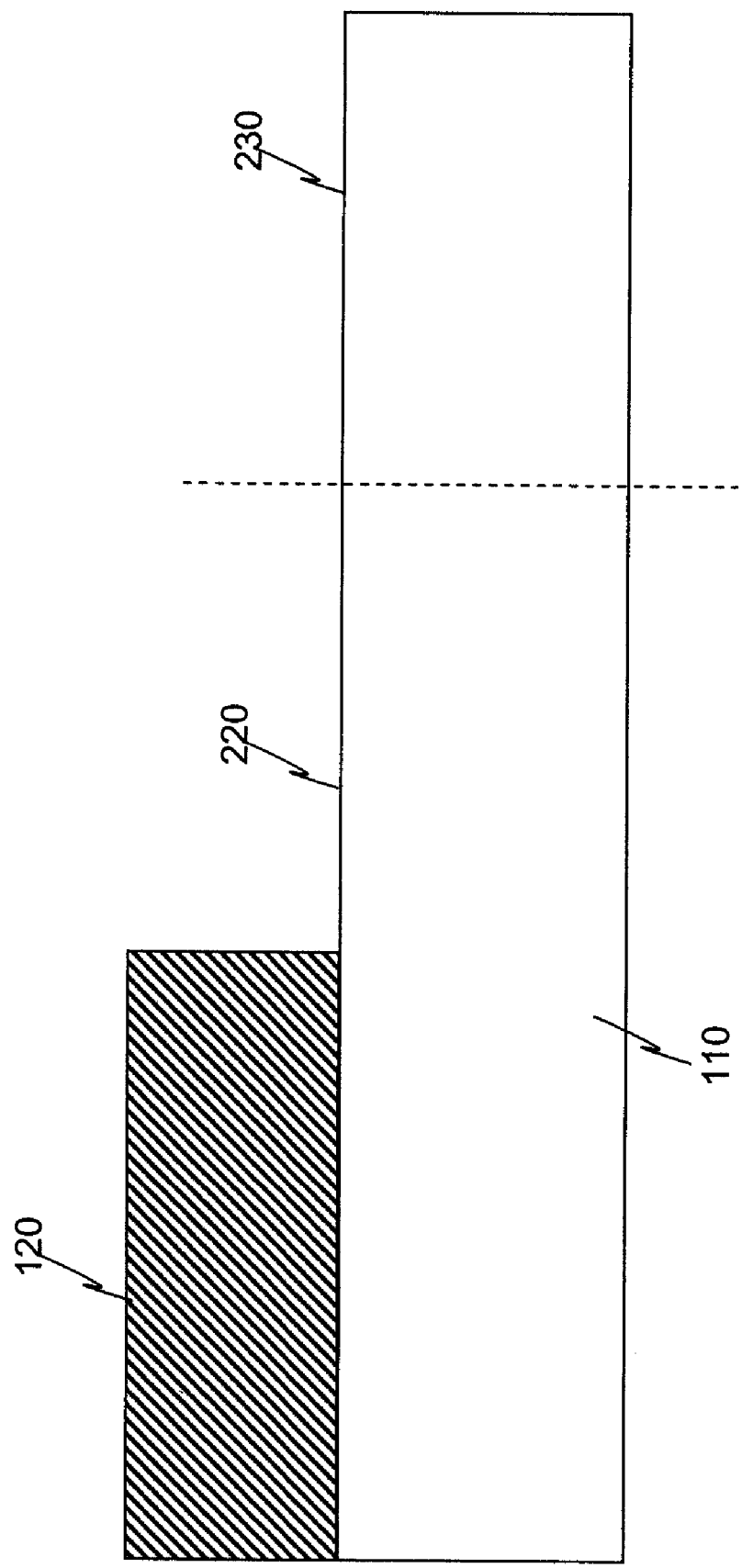
FIG. 2 shows a structure with portions of a dielectric layer removed from areas corresponding to certain devices.

Referring now to FIG. 2, portions of the thick dielectric 120 are removed from areas that will have a thin dielectric layer. The removal may be accomplished in a conventional manner using techniques known in the art, such as by masking and etching. By way of example, a buffered hydrofluoric (BHF) acid may be used to etch away the dielectric layer from areas 220 and 230. A vertical dotted line conceptually divides these areas for illustrative purposes.

The structure, particularly the oxide layer, may then be cleaned using a cleaning process suitable for the gate dielectric 120 and semiconductor substrate 110, such as an industry standard RCA cleaning process. The RCA process entails applying several cleaning solutions, each followed by a quick-dump rinse (QDR) using deionized water. First, an aqueous solution of a sulfuric acid/hydrogen peroxide mixture (SPM) is applied to remove, for example, photoresist residue and particulate type organic contaminant from the wafer surface. A QDR is then performed. Next, a cleaning solution, such as an SC1 cleaning solution ($NH_4OH/H_2O_2/H_2O=1:1:5$), is applied at a temperature of about 75° C. to 85° C. to clean the surface and remove organic compounds and particulate. Then another QDR is performed. Next, another cleaning solution, such as an SC2 solution ($HCl/H_2O_2/H_2O=1:1:6$), is applied at a temperature of 75° C. to 85° C. to further clean the surface. Afterwards, another QDR is performed. Next, a final rinse may be performed to further clean the structure. A drying step may then be performed, for example using isopropyl alcohol (IPA) vapor to remove moisture and dry the structure.

Figure 3:
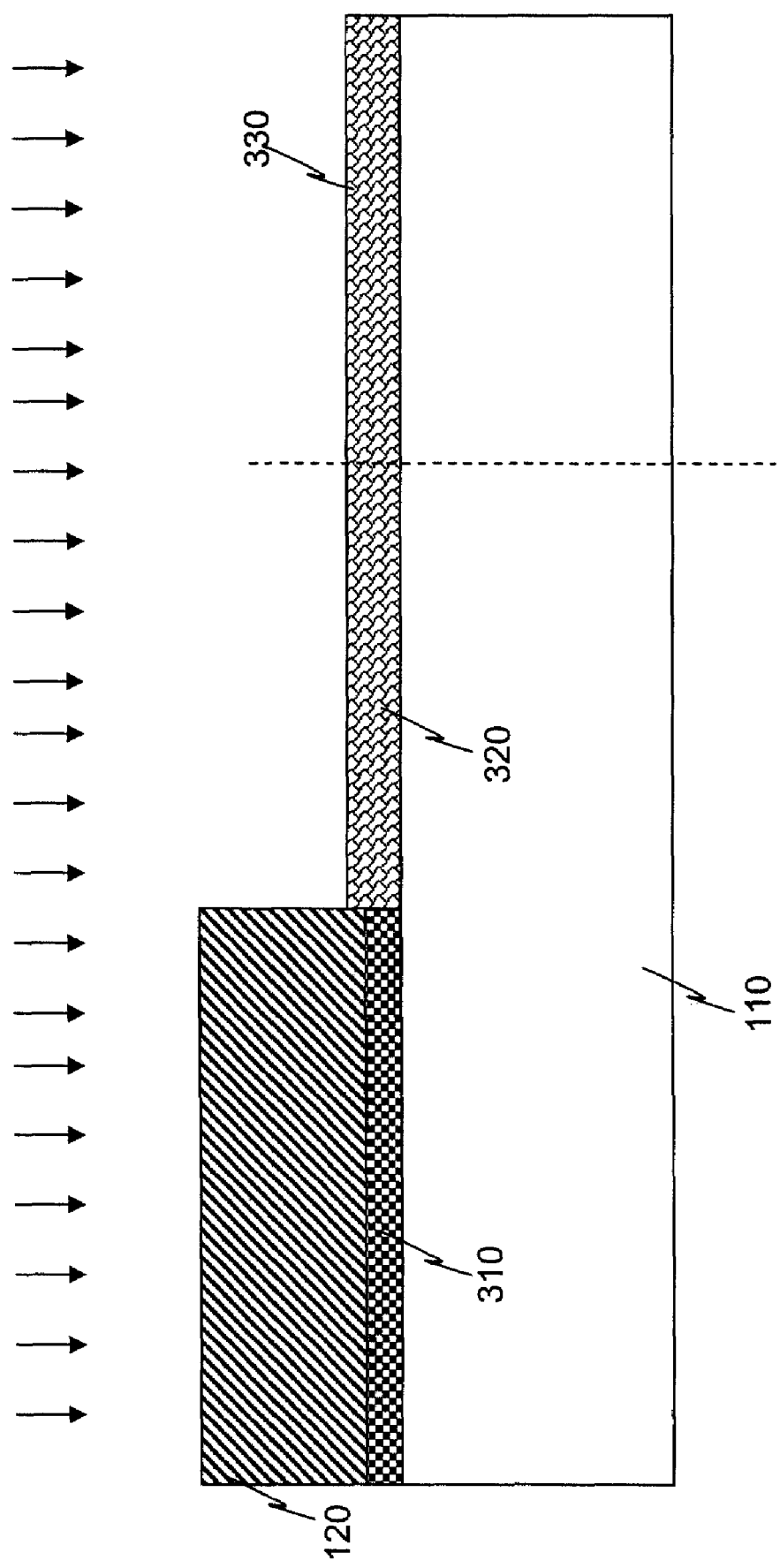
FIG. 3 shows a structure with a dielectric layer that has been introduced with nitrogen according to the principles of an exemplary implementation of the invention.

After cleaning, a first dose (e.g., a high dose) of nitrogen is introduced as shown in FIG. 3. Various techniques may be employed for nitridation in accordance with the principles of the invention. For example, the entire structure may receive a high concentration of nitrogen in the range of $8\times10^{14}$ to $1\times10^{22}$ atoms/cm³, after which, areas warranting a low concentration of nitrogen may be stripped of the concentrated nitrogen containing layer and then subjected to a low dose of nitrogen.

Nitrogen may be introduced by subjecting the device to a nitrogen containing gas such as ammonia ($NH_3$). The exposure introduces a first amount of nitrogen (e.g., a relatively high concentration) into the dielectric. During the time in which the substrate is exposed to the gas, an annealing process may be carried out. The annealing process may take place using a conventional furnace process or a rapid thermal process. The annealing conditions may include a temperature within the range of about 400° C. to 800° C., a pressure of 10 torr to 1 atmosphere, and an annealing time of 15 seconds to 120 minutes depending upon the type of process. The duration, temperature and pressure may be varied to increase or decrease the amount of nitrogen introduced in the dielectric. By way of example, and not limitation, a nitridation step according to the annealing conditions described above may produce a layer with a high concentration of nitrogen in the range of $8\times10^{14}$ to $1\times10^{22}$ atoms/cm³. However, other levels of nitrogen concentration may be achieved. Indeed, various nitrogen levels may be desired, based upon the type of corresponding device, subsequent processing conditions, the gate oxide dielectric, doped semiconductor layer, and the concentration of the $p_+$ impurity formed within doped semiconductor layer. It is the added nitrogen which prevents p-type dopant impurities (for example Boron) from diffusing into the gate dielectric film and further diffusing into the channel region of the semiconductor structure. The presence of nitrogen also reduces current leakage. Upon completing this step, an oxynitride layer 310 formed near the substrate 110 interface of the dielectric layer 120. A nitride (e.g., $Si_3N_4$) layer forms over areas 320 and 330 from which the dielectric was removed.

Figure 4:
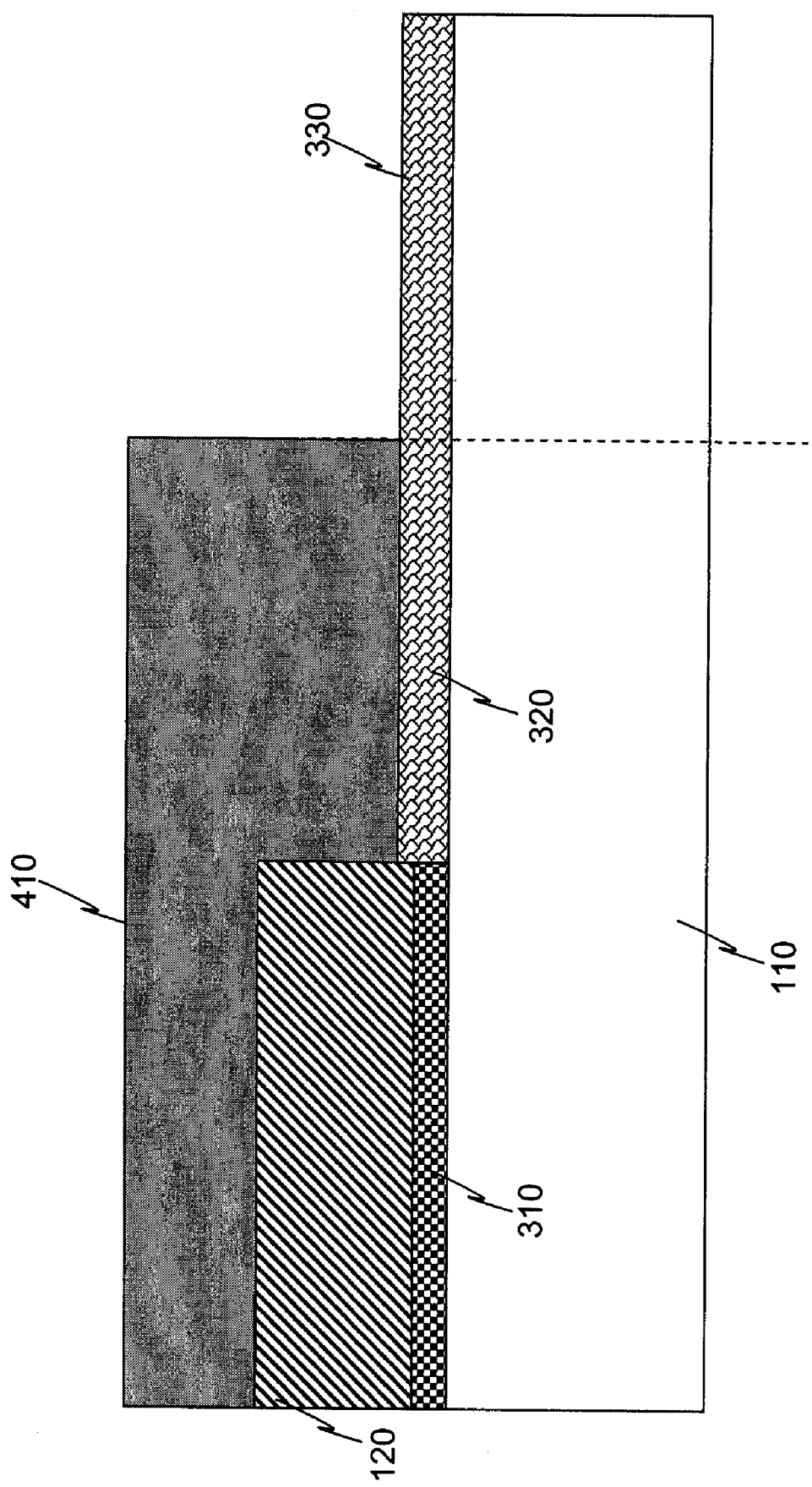
FIG. 4 shows a structure with a nitrogen-enriched dielectric layer that is masked and a nitride layer that is partially masked according to the principles of an exemplary implementation of the invention.

Next, the nitride is removed from areas that will not benefit from the first dose of nitrogen. For example, if the first dose is configured to impart a relatively high concentration of nitrogen (e.g., greater than $8\times10^{14}$ atoms/cm³), then the dielectric may be removed from areas designed to accommodate pFETs, such as for example area 330. As nFETs with thin gate dielectric layers benefit substantially from a relatively high concentration of nitrogen (e.g., greater than $8\times10^{14}$ atoms/cm³), the dielectric may be left in those areas, such as for example 320. Nitrogen-enriched dielectric may also be left in areas corresponding to a relatively thick gate dielectric, such as 120, though the impact of nitrogen in such areas may be rather muted. The removal from area 330 may be accomplished in a conventional manner using techniques known in the art, such as by masking and etching. A photoresist mask 410, as shown in FIG. 4, may cover areas 120 and 320. By way of example, a buffered hydrofluoric acid (BHF) may be used to etch away the nitride from area 330.

Figure 5:
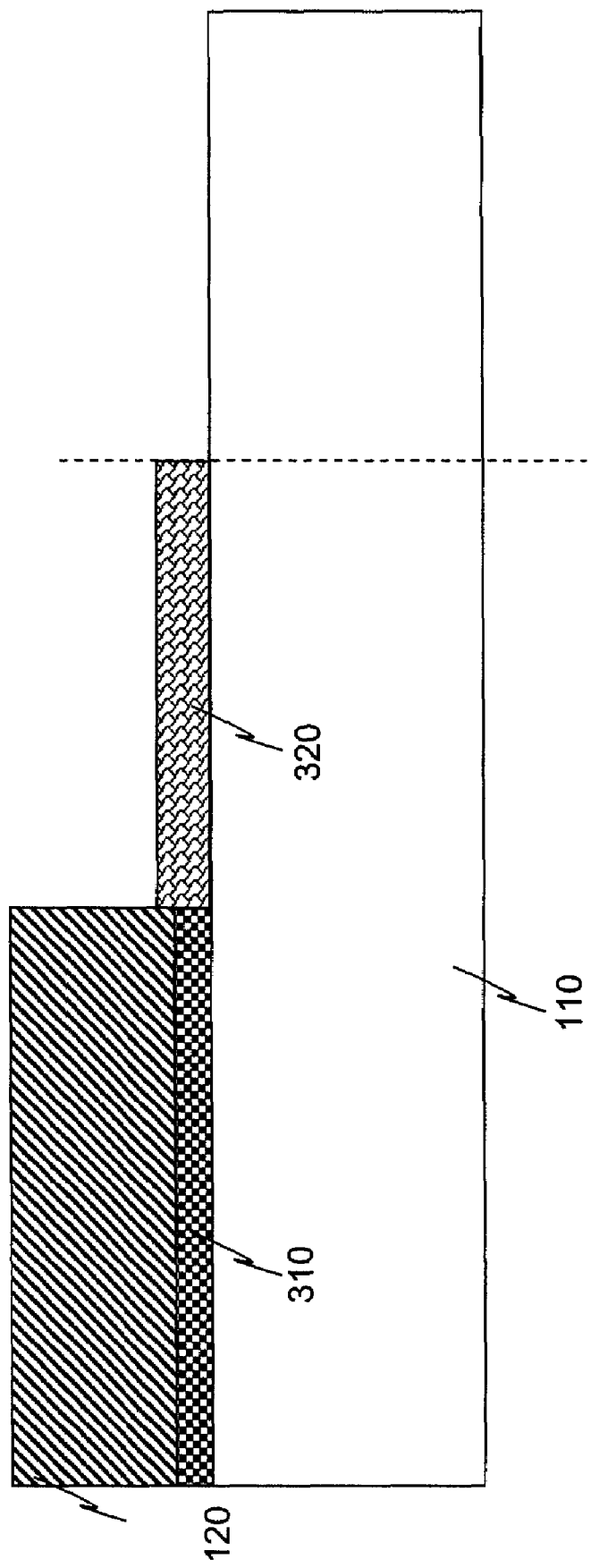
FIG. 5 shows a structure with an unmasked portion of the nitride layer removed according to the principles of an exemplary implementation of the invention.

After etching away the dielectric layer from the determined areas, such as 330, the mask 410 is removed from the structure. Mask removal can be accomplished by conventional wet stripping (e.g., acetone or sulfuric acid-based process) or dry stripping (e.g., reactive plasma, ozone or ultraviolet/ozone-based process). The resulting structure is shown in FIG. 5.

Figure 6:
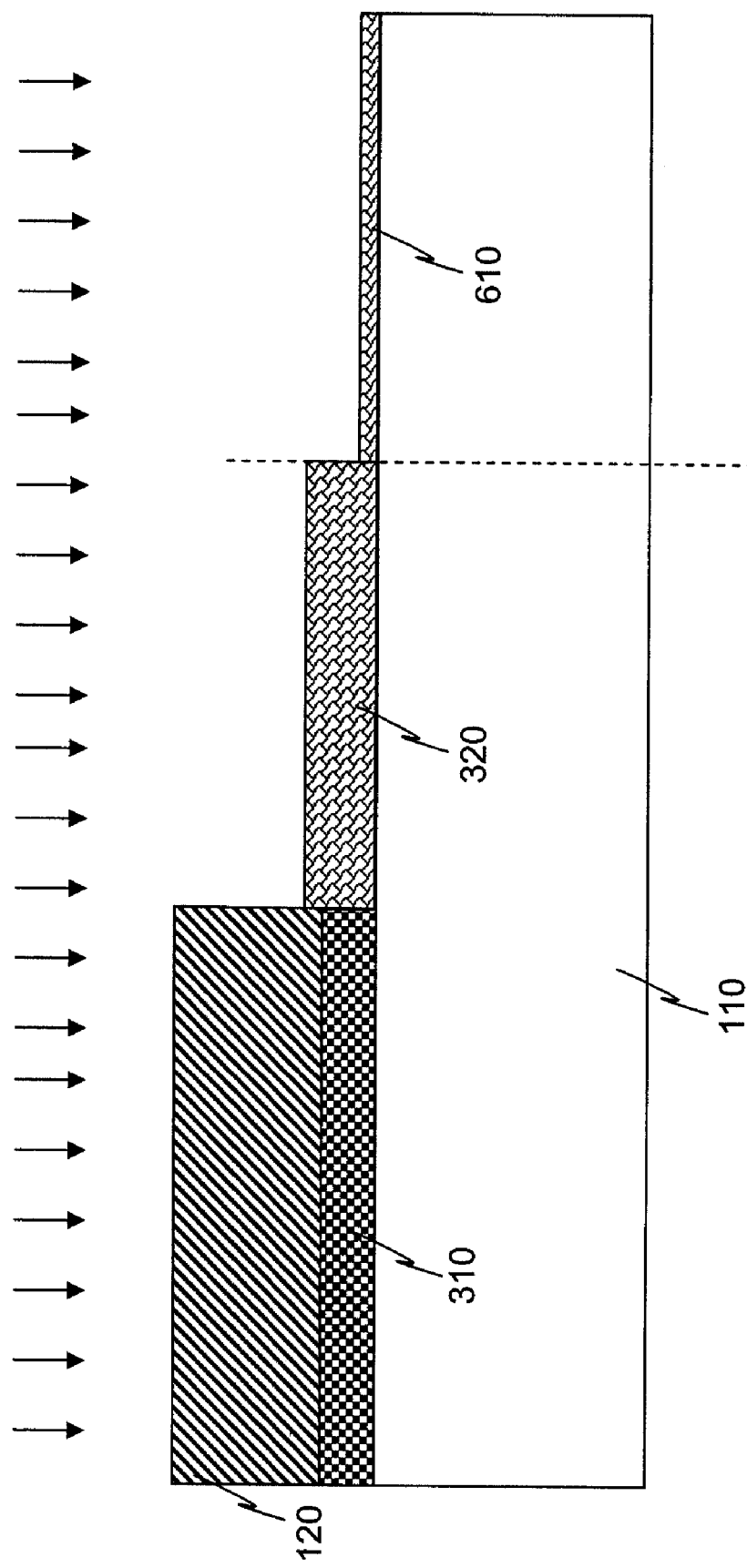
FIG. 6 shows a structure that has been introduced with nitrogen according to the principles of an exemplary implementation of the invention.

After removal of the mask, the entire unmasked surface may be subjected to another dose of nitrogen, such as by exposing the structure to a nitrogen containing gas such as ammonia ($NH_3$), as shown in FIG. 6. This exposure forms a thin nitride ($Si_3N_4$) film 610 on exposed substrate, introduces additional nitride on layer 320 and introduces a second amount of nitrogen into the dielectric area 310. During the time in which the structure is exposed to the gas, an annealing process is carried out. The annealing process may take place using a conventional furnace process (i.e., furnace nitridation) or a rapid thermal process (i.e., rapid thermal nitridation). The annealing conditions may include a temperature within the range of about 400° C. to 800° C., a pressure of 10 torr to 1 atmosphere, and an annealing time of 15 seconds to 120 minutes depending upon the type of process. The duration, temperature and pressure may be varied to increase or decrease the amount of nitrogen introduced. By way of example and not limitation, a nitridation step according to the conditions described above may add nitrogen in the range of $1\times10^{13}$ to $1\times10^{15}$ atoms/cm$^3$ (e.g., $1\times10^{14}$ to $1\times10^{15}$ atoms/cm$^3$). The thickness of nitride file 610 may be approximately 10 to 50 Å. However, other levels of nitrogen concentration and other film thicknesses may be achieved.

Figure 7:
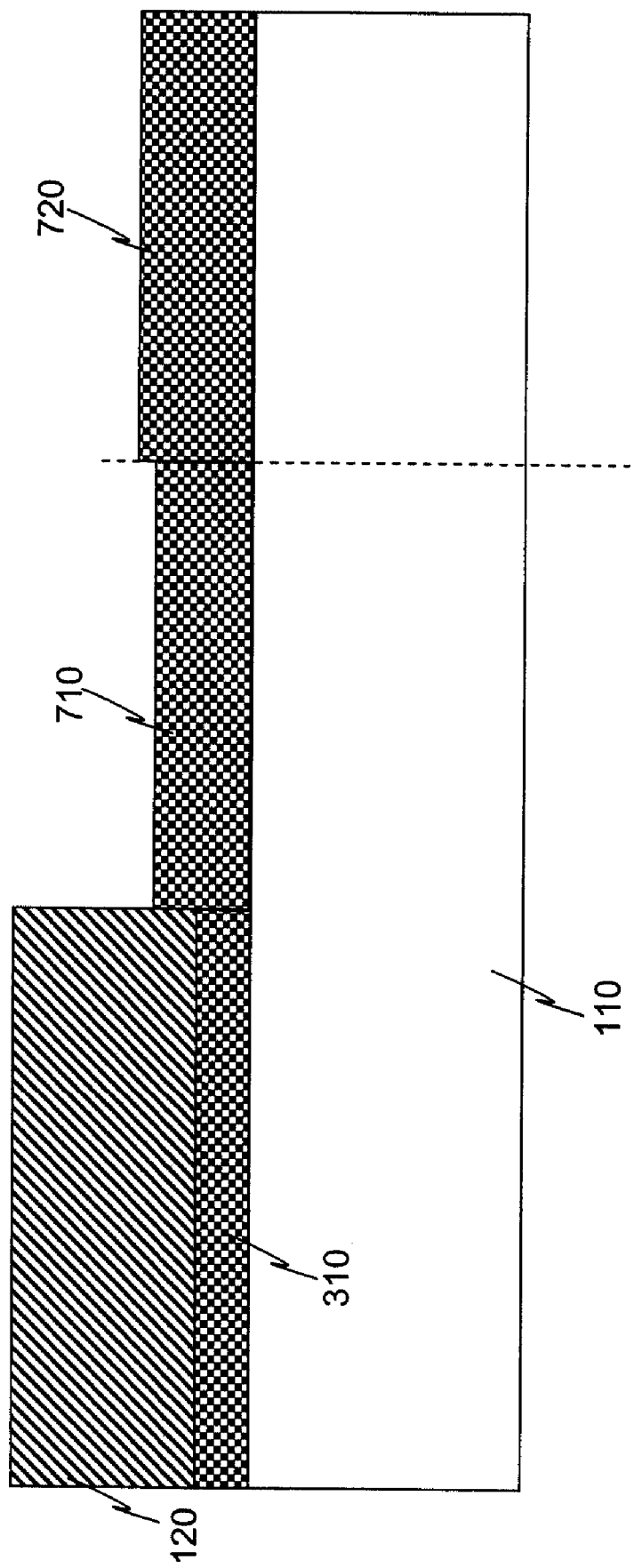
FIG. 7 shows a structure upon which an oxide is formed according to the principles of an exemplary implementation of the invention.

After nitrifying the substrate surface, the device is reoxidized such as by a wet oxide process in a furnace, free radical enhanced rapid thermal oxidation, or other oxidation method known in the art, to convert the nitride films 320 and 610 (FIG. 6) to oxynitride layers 710 and 720, as shown in FIG. 7, thereby forming a thin gate dielectric. By way of example, free radical enhanced rapid thermal oxidation may be performed by flowing $O_2$ and $H_2$ into a single wafer tool operating at elevated temperatures. The $O_2$ and $H_2$ react on the hot wafer, for example, to create $H_2O$ and atomic oxygen used to oxidize the film. Depending upon the desired thickness and process parameters, reaction times may vary 2–300 seconds. Reaction temperatures may vary between 600–1200 C. The high concentration of nitrogen in the film 320 retards oxide formation. Thus, the thickness of area 710 is less than the thickness of area 720. The oxidation step may also further oxidize portion 120 of the dielectric layer, increasing its thickness slightly.

Figure 8:
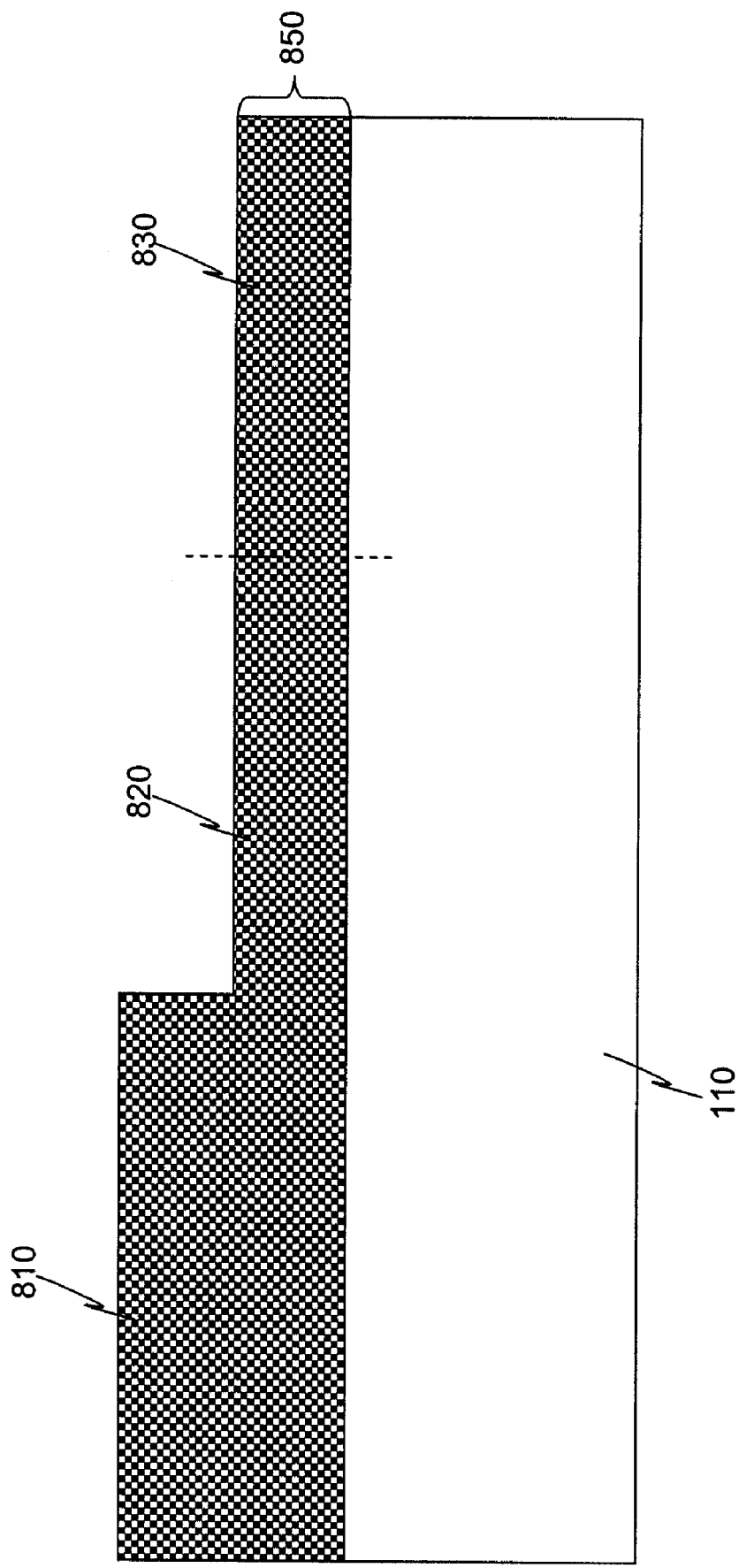
FIG. 8 shows a structure with a dielectric layer that has been uniformly enriched with nitrogen according to the principles of an exemplary implementation of the invention.

Referring now to FIG. 8, a process step of an alternative nitridation process, namely a plasma nitridation process, is illustrated. Remote plasma nitridation (RPN) using microwave or decoupled plasma nitridation (DPN) using radio frequency may interact with a nitrogen-containing gas to generate plasma containing nitrogen radicals. The dielectric layer 850, which may include thin areas 820 and 830 and thick areas 810, and nFET 820 and pFET 830 areas, is exposed to plasma that contains nitrogen. An exemplary gas composition of the plasma is 75% helium and 25% nitrogen at a pressure of 20 to 80 mTorr. The plasma nitrogen concentration may vary from 10% to 25%, with helium providing the balance. Instead of helium, neon or argon may be chosen. A source of nitrogen is introduced into the plasma to form the nitrogen-containing plasma. The source of nitrogen may be $N_2$, $NH_3$, NO, $N_2O$, and/or mixtures thereof. The plasma may be applied at 10 to 50 W for 10 to 60 seconds.

The substrate 110 can be unbiased in which case the ionized substances are accelerated by the plasma potential and then implanted into the insulating surface. Alternatively, a bias voltage can be applied to the substrate to further accelerate the ions from the plasma and implant them deeper into the insulating layer. Either a direct current or a radio frequency bias voltage can be used to bias the substrate. This step of the alternative process thus introduces a first (e.g., relatively low) concentration of nitrogen into the dielectric layer via plasma nitridation.

Figure 9:
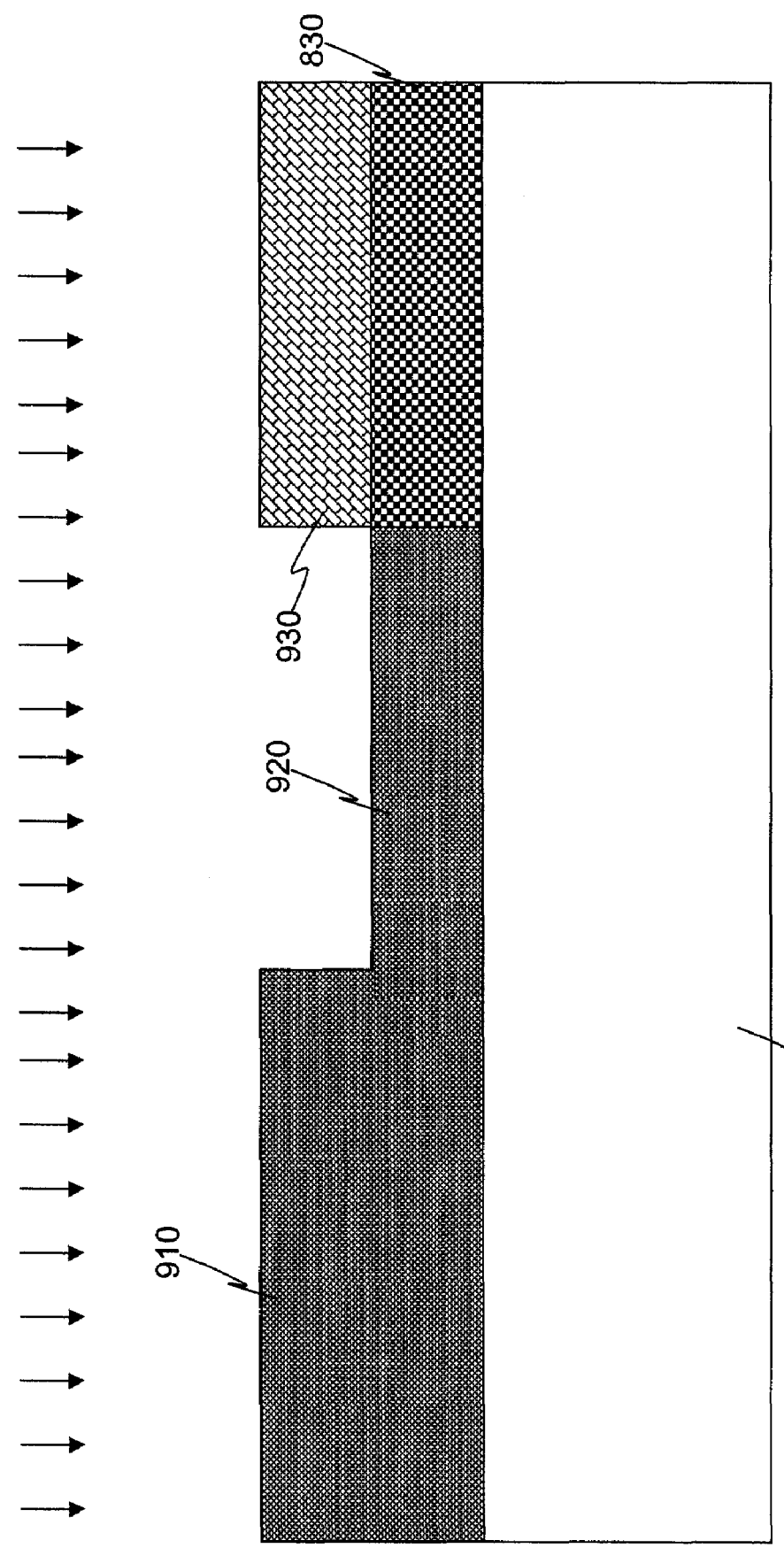
FIG. 9 shows a structure with a nitrogen-enriched dielectric layer having an unmasked portion with a first concentration of nitrogen and a masked portion with a second concentration of nitrogen according to the principles of an exemplary implementation of the invention.

Next, as shown in FIG. 9, a mask 930 (e.g., a photoresist mask) is formed over select areas of the structure. The mask 930 may cover those areas that do not warrant an additional dose of nitrogen, such as thick areas (e.g., having a thickness greater than 50 Å) and/or areas corresponding to pFETs 830. Areas of the dielectric layer which correspond to nFETs 820 (FIG. 8) are not masked, because they will receive additional nitridation. Thick areas 810 (FIG. 8) may be unmasked, because the effect of nitrogen is muted in such areas. Masking may be accomplished using well known techniques in a conventional manner.

After masking, a second plasma nitridation step is performed. The unmasked dielectric layer areas 810 and 820 of FIG. 8 are exposed to plasma that contains nitrogen, which form layers 910 and 920, as shown in FIG. 9. An exemplary gas composition of the plasma is 75% helium and 25% nitrogen at a pressure of 20 to 80 mTorr. The plasma nitrogen concentration may vary from 10% to 25%, with helium providing the balance. Instead of helium, neon or argon may be chosen. A source of nitrogen is introduced into the plasma to form the nitrogen-containing plasma. The source of nitrogen may be $N_2$, $NH_3$, NO, $N_2O$, and/or mixtures thereof.

The plasma may be applied at 10 to 50 W for 10 to 60 seconds. The substrate can be unbiased in which case the ionized substances are accelerated by the plasma potential and then implanted into the insulating surface. Alternatively, a bias voltage can be applied to the substrate to further accelerate the ions from the plasma and implant them deeper into the insulating layer. Either a dc or a rf bias voltage can be used to bias the substrate. This step thus introduces a second (e.g., relatively low, medium or high) concentration of nitrogen into the dielectric layer via plasma nitridation for those areas that can benefit from and/or tolerate a high concentration of nitrogen.

Figure 10:
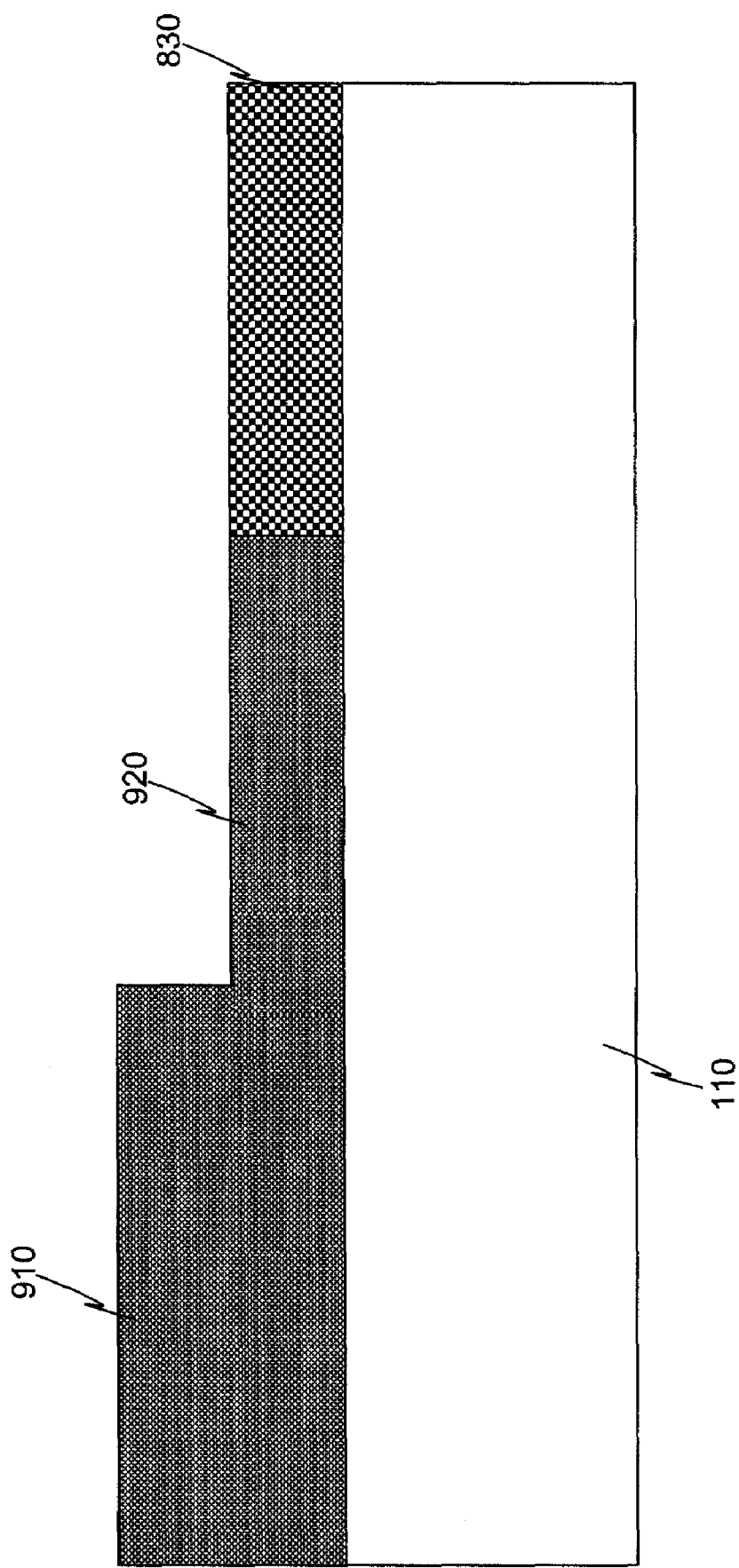
FIG. 10 shows a structure with a nitrogen-enriched dielectric layer having a portion with a first concentration of nitrogen and another portion with a second concentration of nitrogen according to the principles of an exemplary implementation of the invention.

After the second plasma nitridation step, the mask 930 is removed from the structure, as shown in FIG. 10. Mask removal can be accomplished by conventional wet stripping (e.g., acetone or sulfuric acid-based process) or dry stripping (e.g., reactive plasma, ozone or ultraviolet/ozone-based process). The dielectric layer thus includes areas 910 and 920 that were subject to both the first and second plasma nitridation and therefore contain a relatively high concentration of nitrogen. The dielectric layer also includes area 830, which was exposed to the first plasma nitridation, but masked from the second.

Figure 11:
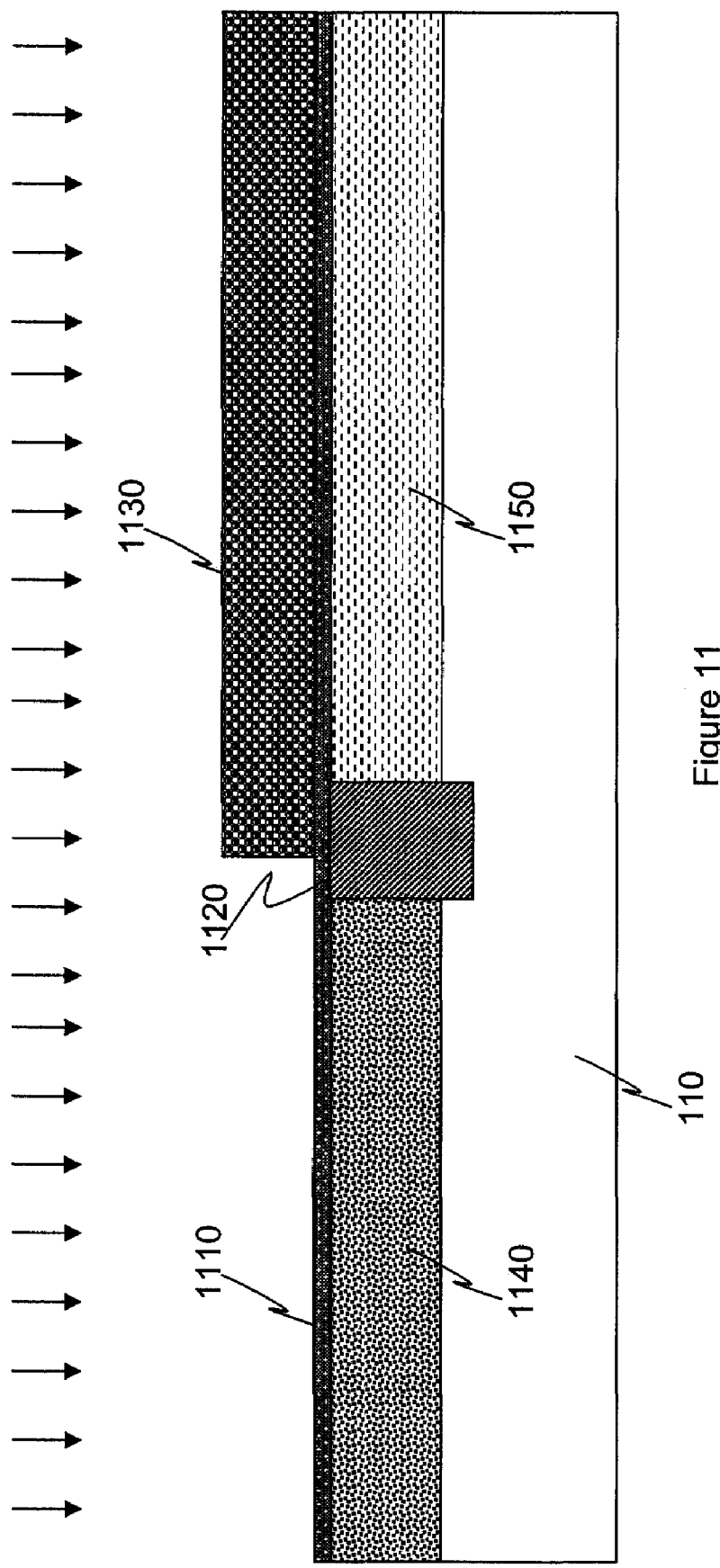
FIG. 11 shows a structure with a trench isolation, wells, a sacrificial oxide layer and a mask over a first area according to the principles of an exemplary implementation of the invention.

In another alternative nitridation process in accordance with an exemplary embodiment of the invention, nitrogen is selectively implanted into n-wells and/or p-wells of FETs to provide a nitrogen enriched interface between the well and gate dielectric. Referring now to FIG. 11, an exemplary substrate 110 is shown with a trench isolation 1120 separating p-well 1140 from n-well 1150, each of which may be formed using well known techniques. An optional sacrificial $SiO_2$ layer 1110 having a thickness of between 50–250 Å may be formed in a conventional manner. The sacrificial $SiO_2$ layer 1110 may be omitted without departing from the scope of the invention. Next, a first photoresist mask 1130 may be formed over select portions of the device using well known techniques. The unmasked portions will be exposed to nitrogen via implantation.

After implantation, the first mask may be removed and a second mask may optionally be formed over other areas of the device using well known techniques. By way of example, areas corresponding to nFETs with a thin gate dielectric may receive a first nitrogen implantation. Areas corresponding to pFETs with a thin gate dielectric may receive a second nitrogen implantation. Areas corresponding to a device with a thick gate dielectric may receive another nitrogen implantation.

Referring again to FIG. 11, the mask 1130 may mask those areas of the structure which are to become pFET regions 1150, and expose those portions of the structure which are to become nFET regions 1140. Nitrogen may be implanted through sacrificial oxide layer 1110 into underlying unmasked wells 1140 for n-FET regions. Sacrificial oxide layer 1110 attenuates the implantation so that the majority of implanted nitrogen atoms form a nitrogen enriched area at the well surface 1140. Mask 1130 prevents area 1150 from being implanted with nitrogen while area 1140 is implanted with nitrogen. A high dose of implanted nitrogen may yield approximately $8 \times 10^{14}$ to $1 \times 10^{22}$ atoms/$cm^3$ in the well. After implantation, the mask 1130 is stripped using well known techniques.

Figure 12:
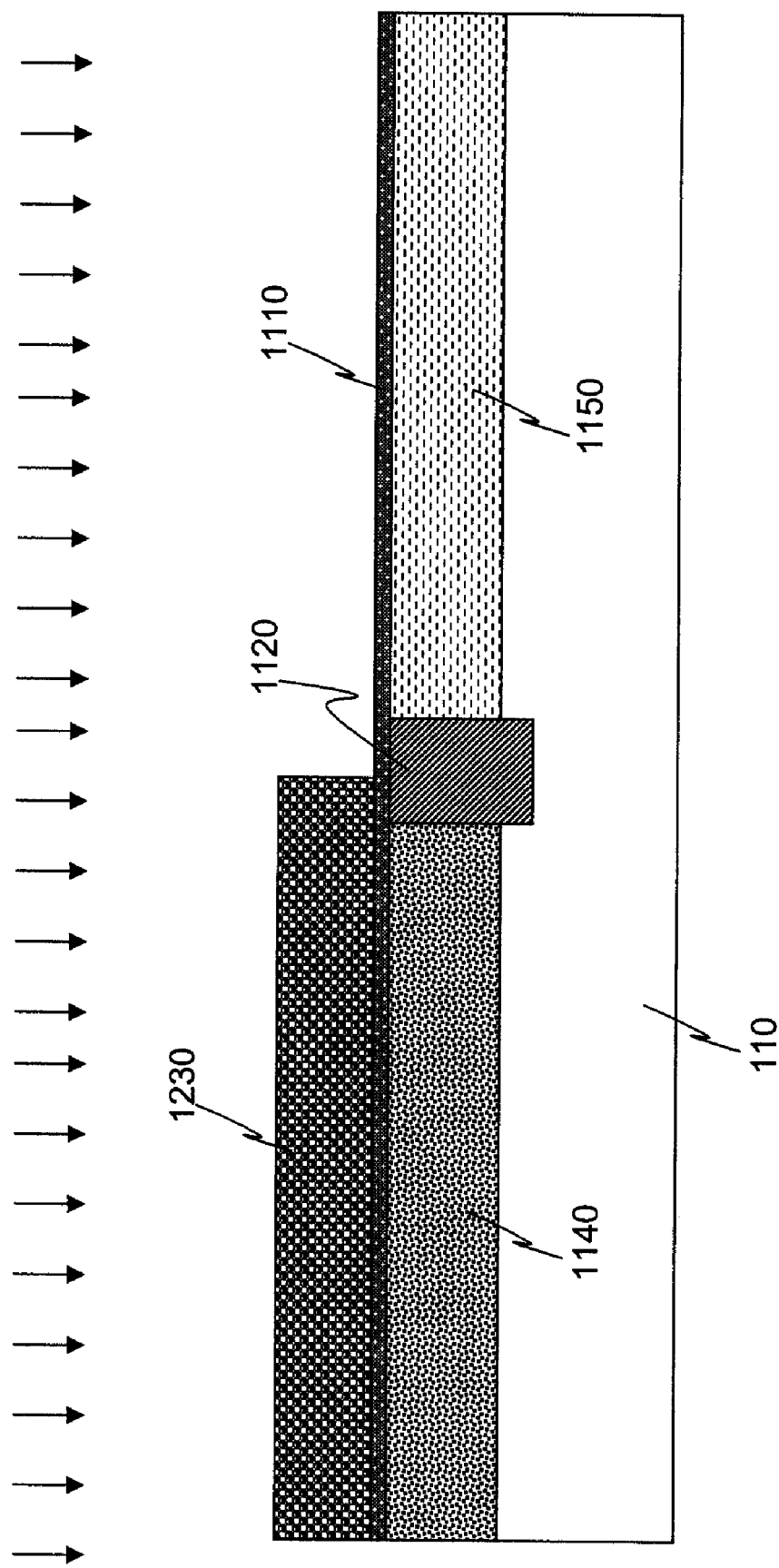
FIG. 12 shows a structure with a trench isolation, wells, a sacrificial oxide layer and a mask over a second area according to the principles of an exemplary implementation of the invention.

Optionally, nitrogen may also be implanted in n-wells (e.g., well 1150) for p-FET regions. Referring now to FIG. 12, mask 1230 is formed to mask those areas of the structure which are to become nFET regions 1140, and expose those portions of the structure which are to become pFET regions 1150. Alternatively, as nFETs benefit from high nitrogen concentrations, mask 1230 may be omitted. Nitrogen may be implanted through sacrificial oxide layer 1110 into underlying unmasked areas. Sacrificial oxide layer 1110 attenuates the implantation so that the majority of implanted nitrogen atoms form a nitrogen enriched area at the well surfaces 1150. For pFETs, a low dose of implanted nitrogen may yield approximately $1 \times 10^{13}$ to $1 \times 10^{15}$ atoms/$cm^3$ in the well. After implantation, the mask 1230, if any, is stripped using well known techniques. Optionally, a rapid thermal anneal (e.g., 1050° C. for 30 seconds) may be performed to diffuse implanted nitrogen.

Figure 13:
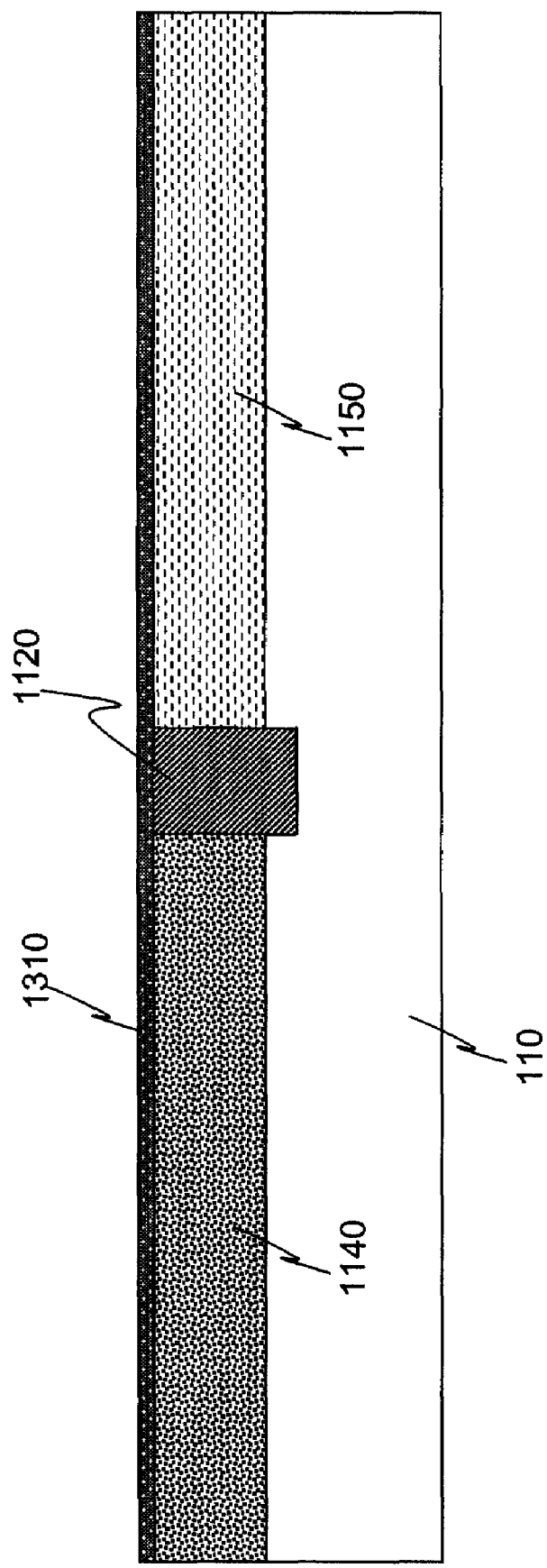
FIG. 13 shows a structure with a trench isolation, nitrogen implanted wells and a dielectric layer according to the principles of an exemplary implementation of the invention.

After all areas have been selectively implanted with nitrogen, the sacrificial oxide layer 1110, if any, can be removed using well known techniques, such as a hydrofluoric acid etch. After removal of the sacrificial oxide, a device-quality gate oxide layer 1310 may be formed, as shown in FIG. 13, using well known techniques. The gate oxide layer 1310 then becomes nitrogen enriched, particularly at the gate-well interface. Subsequently, the gate oxide layer 1310 may be subjected to an additional optional selective nitridation process, using a nitridation technique as discussed above, to further selectively enrich the gate oxide layer.

Figure 14:
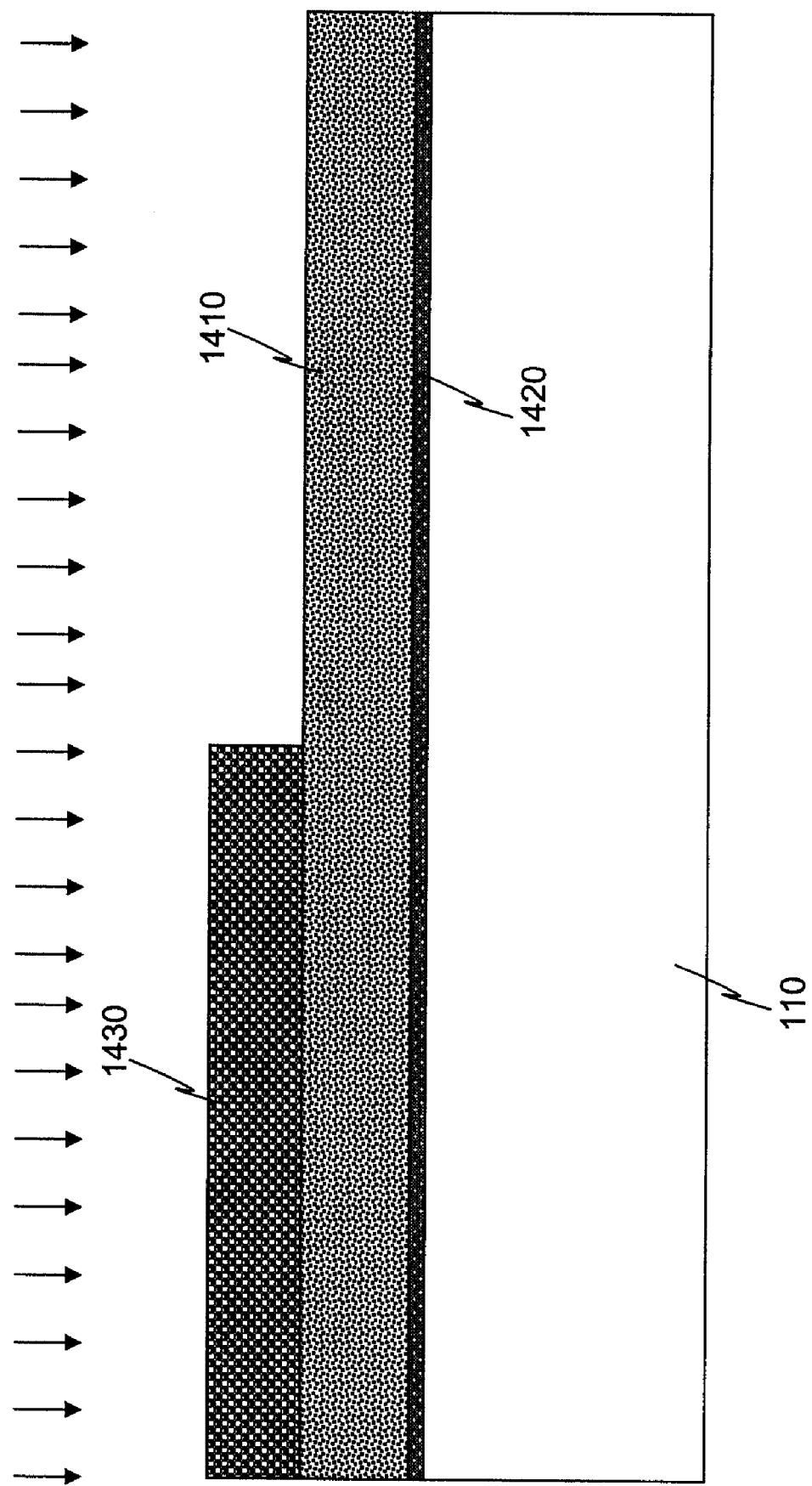
FIG. 14 shows a structure with a dielectric layer, a polysilicon layer and a mask over a first area according to the principles of an exemplary implementation of the invention.

In yet another alternative nitridation process in accordance with an exemplary embodiment of the invention, nitrogen is selectively implanted into gate polysilicon (ploy) after poly blanket deposition. Referring to FIG. 14, a blanket deposited poly layer 1410 is shown, along with a gate dielectric layer 1420 and the substrate 110, all of which may be formed using well known techniques. The implanted nitrogen will migrate down to the gate dielectric layer 1420, particularly near the gate-poly interface.

A first photoresist mask 1430 may be formed over select portions of the poly layer using well known masking techniques. Unmasked portions will be exposed to nitrogen via implantation. After implantation, the first mask may be removed and a second mask may optionally be formed over other areas of the device using well known techniques. By way of example, areas corresponding to nFETs with a thin gate dielectric may receive a first nitrogen implantation (e.g., a high dose). Areas corresponding to pFETs with a thin gate dielectric may receive a second nitrogen implantation (e.g., a low dose). Areas corresponding to a device with a thick gate dielectric may receive another nitrogen implantation.

After nitridation, various devices may be formed. Well known processes may be used to form nFETs and pFETs over p-wells and n-wells, respectively. For example, if not already formed, a polysilicon layer can be blanket deposited (1,000–3,500 Å thick) over the gate oxide layer and patterned into gate electrodes. N-type source/drain regions and p-type source/drain regions can then be formed in a conventional manner, for example by ion implantation. Sidewall spacers may also be formed in a conventional manner. After active devices are formed, they can be coupled together utilizing well known interconnection technology to form a CMOS integrated circuit. As the techniques for forming and interconnecting active CMOS devices are well known in the art, the specific details do not require further discussion.

The overall nitrogen content and profile achieved in a gate dielectric can be controlled by selecting a nitridation process as described above and modulating the nitridation processing conditions. For example, using a lower power setting and a longer process time may provide a higher nitrogen concentration and/or a gradient with a desirably steeper slope.

While nitridation may be accomplished by various nitridation processes, including rapid thermal nitridation (RTN), remote plasma nitridation (RPN), decoupled plasma nitridation (DPN), well implantation and/or poly implantation, a nitridation process which involves a reoxidation step, such as the $NH_3$ annealing process described above, is considered to pose the least risk to gate reliability. The plasma processes use wet etching chemistries to strip a mask, which may damage the gate. Without a subsequent reoxidation step, the damaged gate may remain compromised.

An advantage of an exemplary embodiment of the invention is that leakage currents in thin oxides, e.g., 20 Å or less, are reduced by nitrogen-enriched gate dielectric. Additionally, dopant diffusion from polysilicon gate electrodes into the gate oxide is reduced. Furthermore, channel mobility and transconductance of a FET formed with the nitrogen-enriched gate dielectric according to the present invention are improved. Moreover, nitrogen is selectively introduced, providing high concentrations in areas that benefit most from high concentrations, and low concentrations in areas that may benefit from a low concentration but not a high concentration of nitrogen.

Various integrated circuits include both high voltage and low voltage active devices. High voltage devices typically require a thicker gate dielectric than low voltage devices in order to avoid breakdown. Advantageously, a methodology and device according to the principles of the invention selectively introduces nitrogen to accommodate various gate dielectric thicknesses, and therefore various voltage devices.

While the invention has been described in terms of exemplary embodiments, those skilled in the art will recognize that the invention can be practiced with modifications and in the spirit and scope of the appended claims.

The invention claimed is:

1. A semiconductor structure comprising:
a semiconductor substrate;
a first active device formed on the substrate, the first active device having a first gate dielectric, which has a first concentration of nitrogen; and
a second active device formed on the substrate, the second active device having a second gate dielectric, which has a second concentration of nitrogen different than the first concentration of nitrogen, wherein
the second gate dielectric is thicker than the first gate dielectric, the first gate dielectric has a first thickness susceptible to appreciable dopant diffusion and current leakage, and the second gate dielectric has a second thickness susceptible to appreciable dopant diffusion and current leakage, the second concentration of nitrogen is less than the first concentration of nitrogen, and the second active device is a p-channel field effect transistor and the first active device is an n-channel field effect transistor.

2. A semiconductor structure comprising:

a semiconductor substrate;

a first active device formed on the substrate, the first active device having a first gate dielectric, which has a first concentration of nitrogen; and a second active device formed on the substrate, the second active device having a second gate dielectric, which has a second concentration of nitrogen different than the first concentration of nitrogen, wherein the second gate dielectric is thicker than the first gate dielectric, and the first gate dielectric has a first thickness being susceptible to appreciable dopant diffusion or current leakage; and the second gate dielectric having a second thickness not being susceptible to appreciable dopant diffusion or current leakage.

3. A semiconductor structure according to claim 2, wherein the second concentration of nitrogen is less than the first concentration of nitrogen.

4. A semiconductor structure according to claim 2, wherein the first thickness is less than about fifty angstroms; and the second thickness is about fifty angstroms or greater.

5. A semiconductor structure comprising:

a semiconductor substrate;

a first active device formed on the substrate, the first active device having a first gate dielectric, which has a first concentration of nitrogen; and a second active device formed on the substrate, the second active device having a second gate dielectric, which has a second concentration of nitrogen different than the first concentration of nitrogen, wherein the second gate dielectric is thicker than the first gate dielectric, the first gate dielectric has a first thickness and the second gate dielectric has a second thickness greater than the first thickness, and wherein the second concentration of nitrogen is less than the first concentration of nitrogen, and the first active device is a p-well and the second active device is an n-well.

6. A semiconductor structure comprising:

a semiconductor substrate;

a first active device formed on the substrate, the first active device having a first gate dielectric, which has a first concentration of nitrogen; and a second active device formed on the substrate, the second active device having a second gate dielectric, which has a second concentration of nitrogen different than the first concentration of nitrogen, wherein the second gate dielectric is thicker than the first gate dielectric, the first gate dielectric has a first thickness and the second gate dielectric has a second thickness greater than the first thickness, and wherein the second concentration of nitrogen is less than the first concentration of nitrogen, and the first active device is a n-FET and the second active device is an p-FET.

7. The semiconductor structure of claim 6, wherein the first and second gate dielectrics are each an oxynitride layer.

8. A semiconductor structure comprising:

a semiconductor substrate;

a first active device formed on the substrate, the first active device having a first gate dielectric, which has a first concentration of nitrogen; and a second active device formed on the substrate, the second active device having a second gate dielectric, which has a second concentration of nitrogen different than the first concentration of nitrogen, wherein the second gate dielectric is thicker than the first gate dielectric, the first gate dielectric has a first thickness and the second gate dielectric has a second thickness greater than the first thickness, and wherein the second concentration of nitrogen is less than the first concentration of nitrogen, the first and second gate dielectrics are each an oxynitride layer, and the first active device is a p-well or an n-FET and the second active device is an n-well or a p-FET.

* * * * *